United States Patent
Gonzalez et al.

(10) Patent No.: US 7,504,893 B2
(45) Date of Patent: Mar. 17, 2009

(54) SYSTEM AND METHOD FOR REDUCING TRANSIENT RESPONSES IN A PHASE LOCK LOOP WITH VARIABLE OSCILLATOR GAIN

(75) Inventors: Armando J. Gonzalez, Miami, FL (US); Joseph A. Charaska, Melrose Park, IL (US); Vadim Dubov, Boca Raton, FL (US); William J. Martin, Fort Lauderdale, FL (US)

(73) Assignee: Motorola, Inc., Schaumburg, IL (US)

( * ) Notice: Subject to any disclaimer, the term of this patent is extended or adjusted under 35 U.S.C. 154(b) by 146 days.

(21) Appl. No.: 11/564,965

(22) Filed: Nov. 30, 2006

(65) Prior Publication Data

US 2008/0129388 A1 Jun. 5, 2008

(51) Int. Cl.
*H03L 7/089* (2006.01)
(52) U.S. Cl. ................... 331/17; 327/157; 327/536
(58) Field of Classification Search ............. 327/157, 327/536; 331/17
See application file for complete search history.

(56) References Cited

U.S. PATENT DOCUMENTS

| | | | |
|---|---|---|---|
| 6,181,210 B1* | 1/2001 | Wakayama | 331/8 |
| 6,278,333 B1* | 8/2001 | Le et al. | 331/17 |
| 2006/0068737 A1 | 3/2006 | Koo et al. | |
| 2006/0214698 A1 | 9/2006 | Cho | |

* cited by examiner

*Primary Examiner*—Robert Pascal
*Assistant Examiner*—James E Goodley
(74) *Attorney, Agent, or Firm*—Barbara R. Doutre

(57) ABSTRACT

A system and method for reducing the transient responses in a phase lock loop (PLL) (100) with variable oscillator gain is disclosed. The system includes a charge pump (104) having an adapt mode and a normal mode of operation. The charge pump (104) also includes controlled trickle currents from current sources (208), (210) which are applied to the output (105), (107) of charge pump (104) to minimize the transient responses of the PLL (100). A programmable delay is provided in the charge pump (104) and is configured using a controller (122) based on the variable oscillator gain for the PLL (100). The configured programmable delay is used in the adapt mode of operation for adding a trickle current from the current source (210) to the adapt mode output (107).

26 Claims, 5 Drawing Sheets

SYSTEM AND METHOD FOR REDUCING TRANSIENT RESPONSES IN A PHASE LOCK LOOP WITH VARIABLE OSCILLATOR GAIN

RELATED APPLICATION(S) OR CROSS REFERENCE TO RELATED APPLICATION(S)

This application is related to a co-pending application entitled "A SYSTEM AND METHOD FOR REDUCING TRANSIENT RESPONSE IN A FRACTIONAL N PHASE LOCK LOOP," filed on May 28, 2005 with application Ser. No. 11/139,160, and assigned to the assignee of the instant application.

FIELD OF THE INVENTION

The present invention generally relates to phase lock loops, and more specifically to the reduction of transient responses occurring in phase lock loops with variable oscillator gain.

BACKGROUND

Phase lock loop (PLL) circuits are used in high-speed communication devices and electronic testing instruments to generate a continuous wave signal at a precise and stable frequency. Phase lock loop circuits generally include a reference frequency, a synthesizer and a voltage controlled oscillator (VCO). Two known synthesizers used in PLL circuits are the integer N synthesizer and fractional N synthesizer. Integer N synthesis utilizes whole integer multiples of a reference frequency to synthesize the output frequency thus providing a coarser resolution than fractional N synthesis, which utilizes fractional levels for a finer resolution.

Reducing lock time in a PLL circuit is always of importance in the design of high-speed communication devices. Reduction of lock time requires minimization of transient responses occurring in the PLL circuit. One technique for reducing lock time includes the use of a regular speed (normal) charge pump and a faster speed (adapt) charge pump in a fractional N synthesizer to provide for speedier signal acquisition. Unfortunately, the use of two different charge pumps generates a transition discontinuity, also referred to as a transition glitch, which can negatively impact lock time. The transition glitch increases the transient response for the PLL circuit, thereby also increasing the lock time for the PLL circuit.

Approaches have been suggested to overcome the problem of reducing the transient response in the PLL circuit. However, so far these approaches have been limited to PLL circuits having a constant VCO gain. PLL circuits using the abovementioned technique may exhibit different transient responses when the PLL circuit uses multiple VCOs. Furthermore, for some oscillators, the transient response of the PLL may vary depending on VCO gain (Ko) variation through the band of operation of the VCO. Thus, the reduction of transient responses requires additional efforts for PLL circuits having variable VCO gain.

Accordingly, it would be desirable to have a system and method for reducing transient responses occurring in a phase lock loop with variable oscillator gain.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
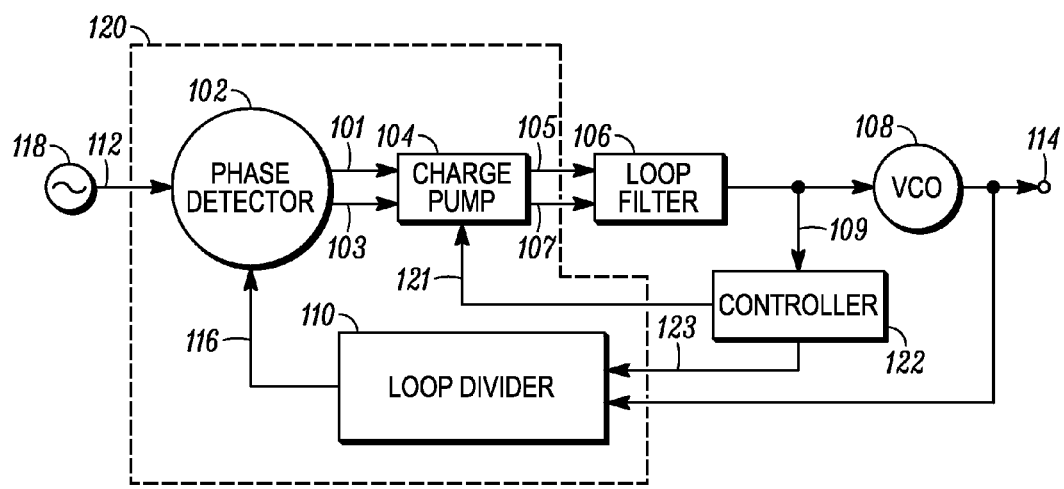
FIG. 1 is a block diagram illustrating a phase lock loop (PLL) in accordance with some embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in a system and method for reducing transient responses occurring in phase lock loop circuits (PLLs) with variable oscillator gain. The PLL of the present invention reduces the lock time by adjusting the current/output from the charge pump depending on the oscillator gain. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Briefly, in accordance with the present invention, there is provided herein a system and method for reducing transient responses occurring in a PLL with variable oscillator gain. The PLL formed in accordance with the present invention primarily includes a synthesizer and the synthesizer includes a charge pump having an adapt and a normal mode of operation. Programmable delay is provided in the charge pump for adding a trickle current to the adapt mode output for the charge pump during the adapt mode of operation. More particularly, a trickle current is selectively added, after a programmable time period, to the adapt mode output to minimize lock time for a PLL with variable oscillator gain. The duration of the programmable time period is determined based on the variable gain of the oscillator in the PLL. Initialization of adapt mode of operation and addition of the trickle current in the abovementioned manner allows reduction of the transient responses in a PLL for variable oscillator gain. In turn, the reduction of transient responses results in minimization of the PLL lock time for different values of oscillator gain.

FIG. 1 is a block diagram illustrating a phase lock loop (PLL) 100 in accordance with some embodiments of the invention. PLL 100 includes a reference source 118, a synthesizer 120, a loop filter 106 and a voltage controlled oscillator henceforth referred to as oscillator 108. The synthesizer is formed of a phase detector 102, a charge pump 104, and a loop divider 110 and is under the control of a controller 122. While loop divider 110 may be, for example, of integer N or fractional N design, other synthesizer configurations may be utilized as well. In accordance with the present invention, charge pump 104 along with controller 122 provides reduced lock time and linearization of the transient responses for PLL 100 with variable oscillator gain.

As described earlier, the charge pump 104 is capable of operating in the normal mode and the adapt mode of operation. Phase detector 102 is coupled to the charge pump 104 for providing an UP signal 101 and a DOWN signal 103. In turn, the charge pump 104 is coupled to the loop filter 106 for providing current 105 or 107. The loop filter 106 is coupled to the oscillator 108, thereby supplying the filtered signal 109. The oscillator 108 produces PLL output 114 based on the filtered signal 109. The PLL output 114 is fed back to the loop divider 110. The output of the loop divider 110 is provided to the phase detector 102 as the feedback frequency signal 116. Controller 122 receives the filtered signal 109 and provides a control signal 121 to the charge pump 104. Controller 122 also generates a loop division factor value 123 for the loop divider 110.

Operationally, the controller 122 initially receives the gain information and provides a control signal 121 to the charge pump 104. The gain information ($K_o$), or in other words information about the oscillator gain and the variation therein, is conveyed by the variable voltage present on the filtered signal 109. The variable voltage occurs as a consequence of a programming change made to the loop divider 110. Controller 122 generates the control signal 121 based on the gain information of oscillator 108. The control signal 121 is provided to the charge pump 104 for configuring a programmable delay used in adapt mode of operation. In some embodiments, the controller 122 may be used for continuously monitoring the oscillator gain and reconfiguring the programmable delay responsive to the gain information.

In synthesizer 120, the phase detector 102 receives a reference frequency signal 112 from reference source 118 and a feedback frequency signal 116 from the loop divider 110. Based on the differences between the signals 112 and 116, the phase detector 102 provides the UP signal 101 and the DOWN signal 103 to the charge pump 104. The charge pump 104 receives the UP signal 101 and the DOWN signal 103 and generates a normal mode current/output 105 and/or an adapt mode current/output 107 depending on the mode of operation.

The charge pump 104 initially functions in the adapt mode of operation. During the adapt mode, an adapt mode trickle current is selectively added to the adapt mode current/output 107 after a delay of predetermined time period. The programmable delay in the charge pump 104, configured as described above, is used to delay the addition of the adapt mode trickle current by the predetermined time period. At the end of adapt mode, the adapt mode output 107 and the adapt mode trickle current are turned off. In some of the embodiments, the adapt and normal mode of operation for the charge pump 104 may occur simultaneously. In other embodiments, the normal mode of operation is initialized at the end of the adapt mode of operation. Furthermore, a normal mode trickle current is added to the normal mode output 105 during the normal mode of operation.

The output of the charge pump 104 is used by the loop filter 106 to generate the filtered signal 109 with variable voltage. The filtered signal 109 is provided to the oscillator 108 to generate the PLL output 114 with the reference frequency. Operationally, the programmable delay is configured based on variable oscillator gain and the charge pump 104 has different configured programmable delay values for different oscillator gains. Hence, for the PLL 100 with variable oscillator gain, the transient responses are reduced and the associated lock time is minimized by changing the configured value for the programmable delay.

Figure 2:
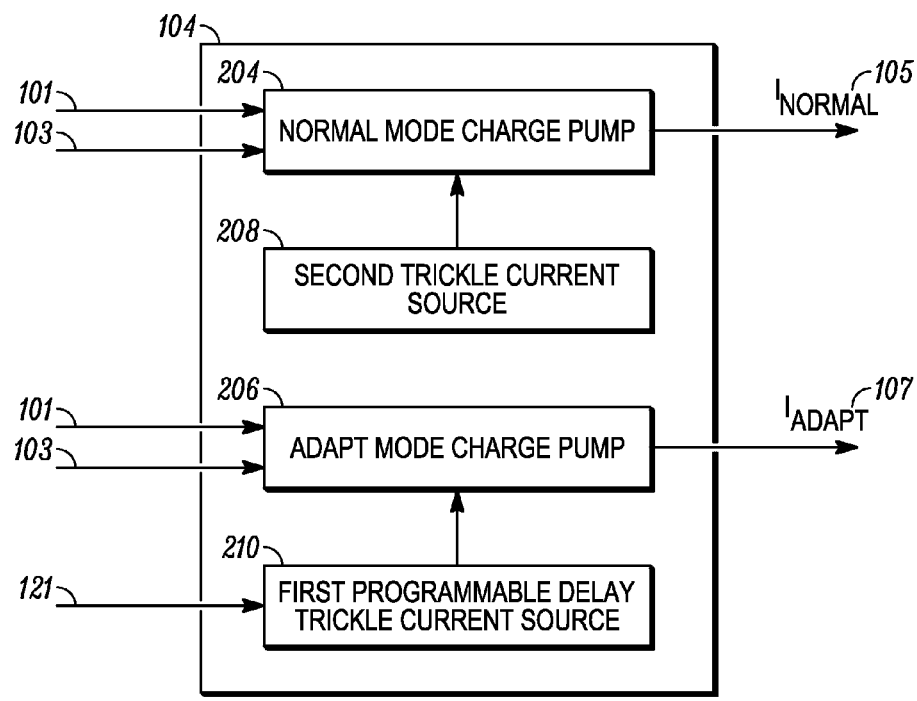
FIG. 2 is a block diagram illustrating the charge pump of the PLL of FIG. 1 in accordance with some embodiments of the invention.

FIG. 2 is a block diagram illustrating the charge pump 104 of PLL 100 in accordance with some embodiments of the invention. In the embodiment of FIG. 2, an adapt mode charge pump 206 and a normal mode charge pump 204 are provided for the adapt mode and normal mode of operation. A first or adapt mode trickle current source 210 is coupled to the adapt mode charge pump 206 for providing the adapt mode trickle current. A programmable delay capable of generating variable delay is provided within the adapt mode trickle current source 210. A second or normal mode trickle current source 208 is coupled to the normal mode charge pump 204 for providing the normal mode trickle current. UP signal 101 and DOWN signal 103 are provided to both the normal and adapt mode charge pumps 204, 206 for enabling the charge pumps depending on the mode of operation. Control signal 121 is provided to the adapt mode trickle current source 210 for configuring the programmable delay. The adapt mode output 107 is generated by the adapt mode charge pump 206, and the normal mode output 105 is generated by the normal mode charge pump 204.

During the operation, the programmable delay in the adapt mode trickle current source 210 is initially configured using the control signal 121. The charge pump 104 enters the adapt mode of operation when the adapt mode charge pump 206 receives signals 101 and 103. The adapt mode charge pump 206 is enabled for a first predetermined time period prior to having a first trickle current added to the adapt mode output 107. The configured programmable delay is used to delay the addition of the adapt mode trickle current by the predetermined time period. In accordance with some of the embodiments, the programmable delay is reconfigurable responsive to change in the control signal 121.

Subsequently, the first trickle current source 210 is turned off and the adapt mode charge pump 206 is disabled upon expiration of a second predetermined period of time, i.e., at the end the adapt mode of operation. In accordance with some of the embodiments, the normal mode of operation is initialized at the end of adapt mode of operation. Accordingly, the normal mode charge pump 204 may be activated by providing signals 101 and 103 upon expiration of the second predetermined period. In other embodiments, the normal mode charge pump 204 may be activated at the same time as the adapt mode charge pump 206. During the normal mode, the second trickle current is added to the normal mode output 105 by the second trickle current source 208.

Figure 3:
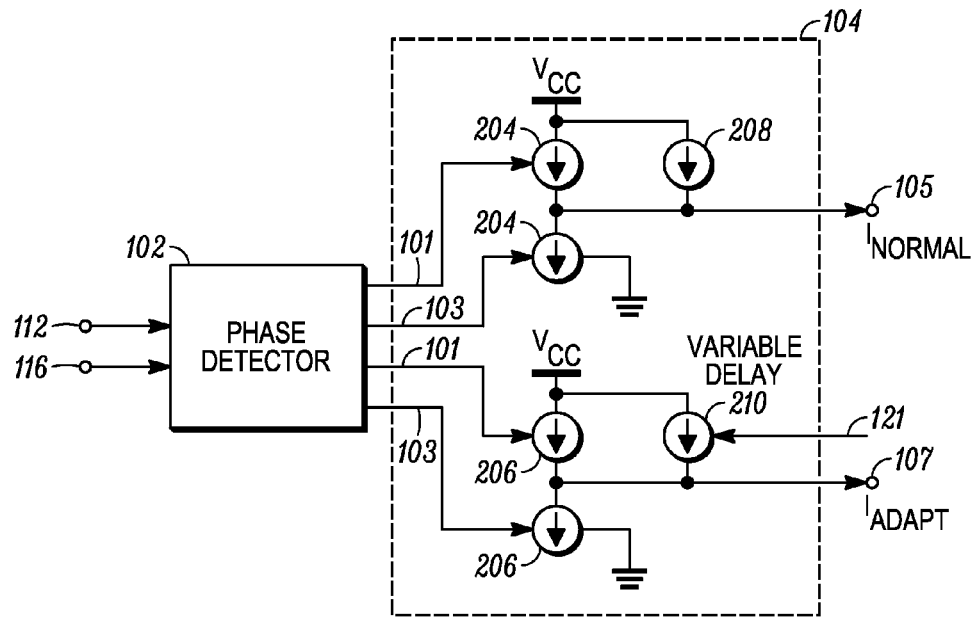
FIG. 3 is a more detailed block diagram of the charge pump of FIG. 2 in accordance with some embodiments of the invention.

FIG. 3 is a more detailed block diagram of the charge pump 104 of FIG. 2 in accordance with some embodiments of the invention. For illustrative purposes, the phase detector 102 is shown with signals 101 and 103 supplied to the charge pump 104 as inputs. In accordance with the embodiments of FIG. 3, the normal mode charge pump 204 and the adapt mode charge pump 206 are formed by two series-connected current sources 204 and 206. The common nodes between the two series-connected current sources 204 and 206 provide the normal mode output 105 and the adapt mode output 107.

During the normal mode, one of the two current sources 204 or combination of two currents sources 204 may be activated by the UP signal 101 or DOWN signal 103 for providing the normal mode output 105. Additionally, a normal mode trickle current source 208 is coupled to the common node between the current sources 204 for adding the normal mode trickle current to the normal mode output 105. For adapt mode, an adapt mode trickle current source 210 is coupled to the common node between the current sources 206 for adding an adapt mode trickle current to the adapt mode output 107. Additionally, a programmable delay is provided within the adapt mode trickle current source 210 for introducing a variable delay when adding the adapt mode trickle current. The programmable delay is configurable responsive to the control signal 121 received by the adapt mode trickle current source 210.

Figure 4:
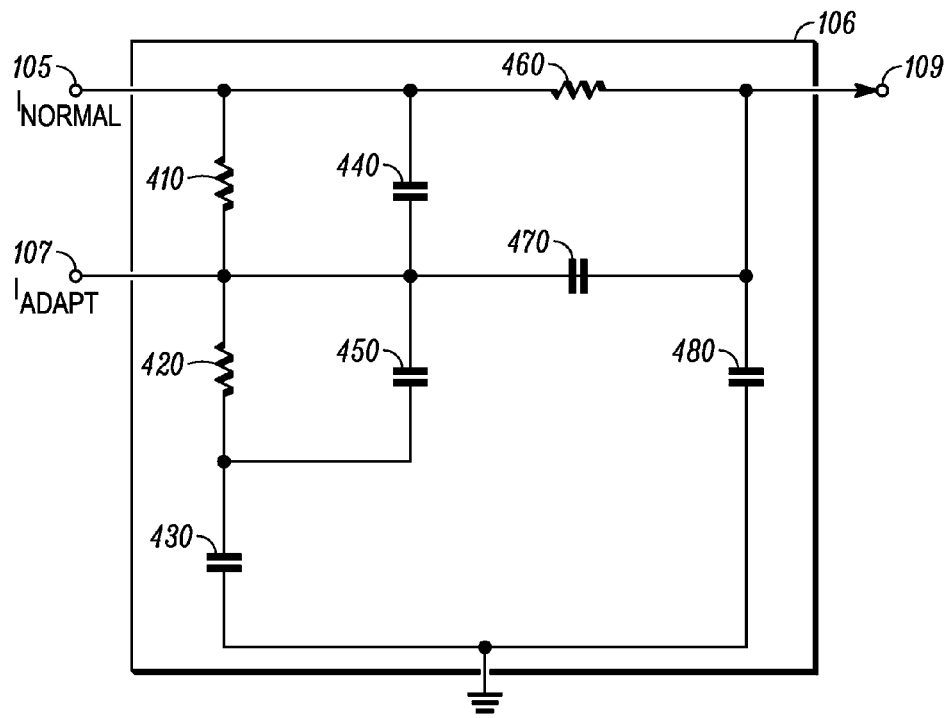
FIG. 4 is a circuit diagram illustrating an example of a loop filter of the PLL of FIG. 1 in accordance with some embodiments of the invention.

FIG. 4 is a circuit diagram illustrating an example of a loop filter 106 of the PLL 100 in accordance with some embodiments of the invention. Loop filter 106 includes resistors 410, 420, and 460 and also includes capacitors 430, 440, 450, 470, and 480. When the charge pump 104 (FIGS. 1, 2, and 3) operates in the adapt mode of operation, loop filter 106 receives the adapt mode output 107. In this case, loop filter in the PLL 100 is configured for the wide bandwidth of operation. When charge pump 104 operates in the normal mode of operation, loop filter 106 receives the current from the normal mode output 105. In this case, loop filter in the PLL 100 is configured for the narrow bandwidth of operation. Wider loop bandwidth of the loop filter in the adapt mode of operation results in faster convergence of the PLL output to the desired output frequency. Narrower bandwidth of the loop filter in the normal mode operation results in slower convergence but leads to lower noise on the PLL output 114. Thus resistors and capacitors of the loop filter 106 are used provide two different bandwidths for filtering based on the input 105 or 107 received by the filter. With reference to FIG. 1, the output of the loop filter 106 is the filtered signal 109 which provides variable voltage to the oscillator 108 for generating the PLL output 114.

Figure 5:
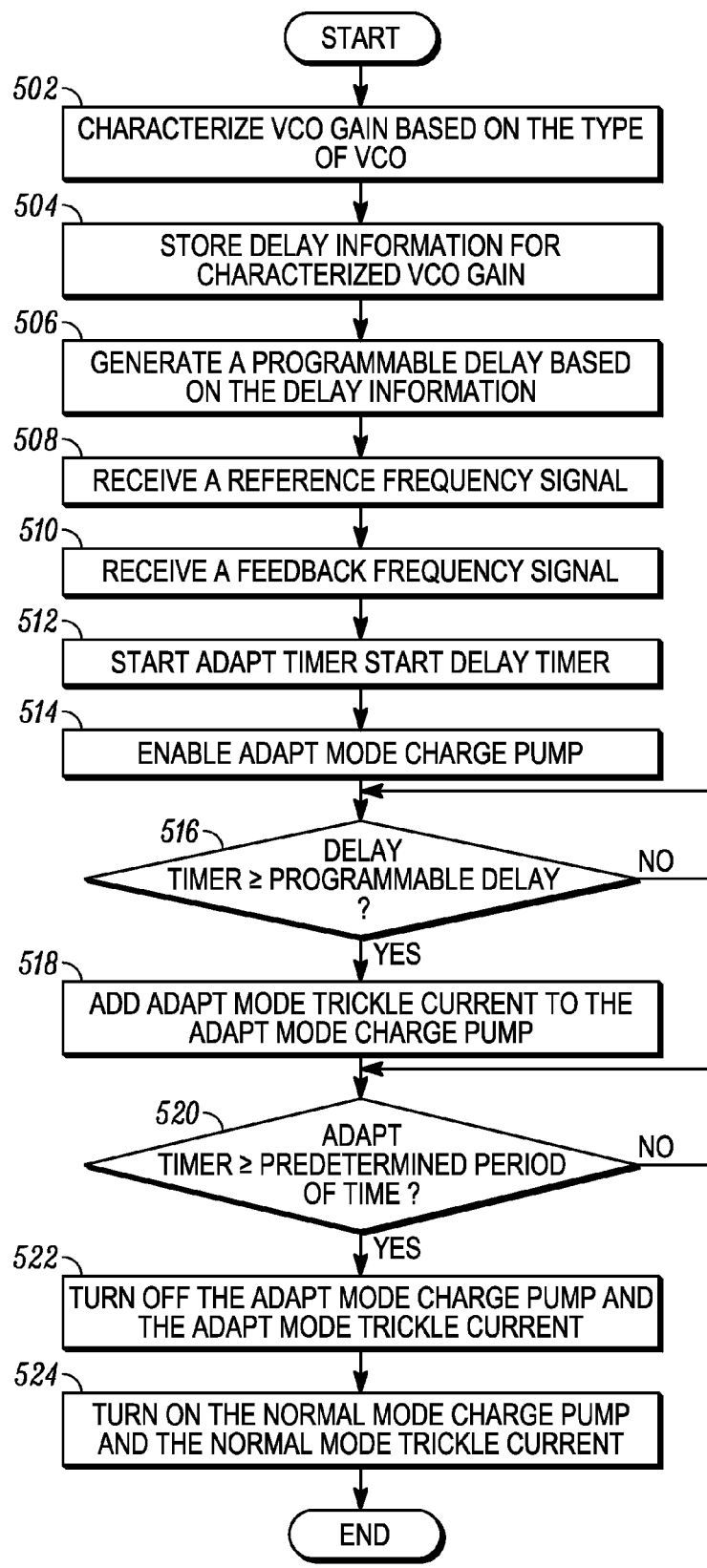
FIG. 5 is a flow chart of a method for reducing transient responses in a PLL in accordance with some embodiments of the invention.

FIG. 5 is a flow chart of a method 500 for reducing transient responses in a PLL in accordance with some embodiments of the invention. Generally, in accordance with the exemplary embodiment of FIG. 5, the method 500 is initialized by the step of configuring the programmable delay based on gain information for an oscillator in the PLL. The gain information of the oscillator is variable based on the oscillator design. Steps 502 through 506 of method 500 illustrate the step of configuring the programmable delay. Step 502 includes characterizing the oscillator's gain information or the oscillator gain based on the type of oscillator. Step 502 extracts the gain information for an oscillator with variable gain. Subsequently, step 504 is used to store corresponding delay information for the characterized gain information. In step 506, programmable delay is generated based on the delay information based on the type and the desired output frequency for the PLL.

The method 500 continues with step 508 by receiving a reference frequency signal. The frequency of the reference signal is used as reference frequency for generating the output signal of the PLL. The step of receiving a feedback frequency signal occurs in 510. Steps 512 and 514 includes initializing the adapt mode of operation for the charge pump. Step 512 is used for starting an adapt timer and starting a delay timer and the adapt mode charge pump is enabled in step 514. Steps 516 and 518 give details for the step of adding the adapt mode trickle current to the adapt mode output of the charge pump after waiting for a time period of the configured programmable delay during the adapt mode of operation.

In step 516, the delay timer of step 512 is compared with the programmable delay of step 506. As soon as the delay timer equals the configured programmable delay, step 518 is used for adding a trickle current to the adapt mode output. Steps 520 and 522 of method 500 describe the step of disabling the adapt mode of operation for the charge pump. Step 520 includes comparing adapt timer of step 512 to a predetermined period time. The predetermined period of time is the duration of the adapt mode of operation for the charge pump. In accordance with some of the embodiments, the adapt mode charge pump and the adapt mode trickle current are turned off after the adapt timer exceeds the predetermined period of time in step 522. In some of the embodiments, method 500 further includes step 524 which includes initialization of the normal mode of operation for the charge pump. Step 524 also includes addition of a normal mode trickle current to the normal mode output. The PLL implementing method 500 continues to be in the normal mode of operation until a different PLL output frequency is desired. Change in the desired PLL output frequency is induced by configuring the loop divider using the loop division value.

Figure 6:
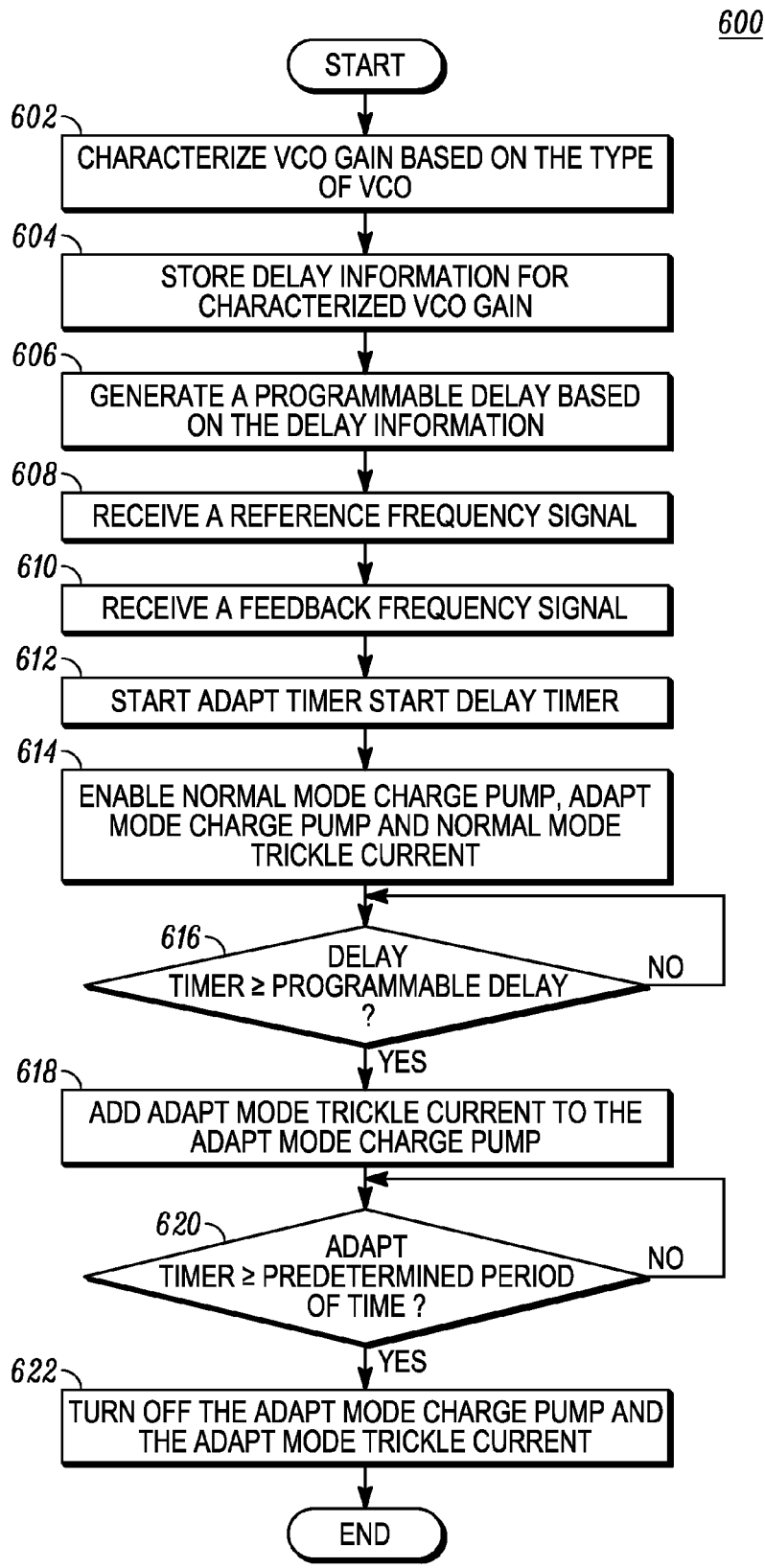
FIG. 6 is another flow chart of a method for reducing transient responses in a PLL in accordance with some embodiments of the invention.

FIG. 6 is another flow chart of a method 600 for reducing transient responses in a PLL in accordance with some embodiments of the invention. In the embodiment of FIG. 6, the method 600 includes simultaneous initialization of the adapt and normal mode of operation for the PLL. The initialization of the normal mode of operation is performed by turning on the normal mode charge pump and adding a normal mode trickle current in step 614. Hence, the embodiments of FIG.6 describing the flow chart for method 600 include initialization of the normal mode operation at the beginning of the adapt mode of operation rather than at the end. The PLL implementing method 600 continues to be in the normal mode of operation until a different PLL output frequency is desired.

Figure 7:
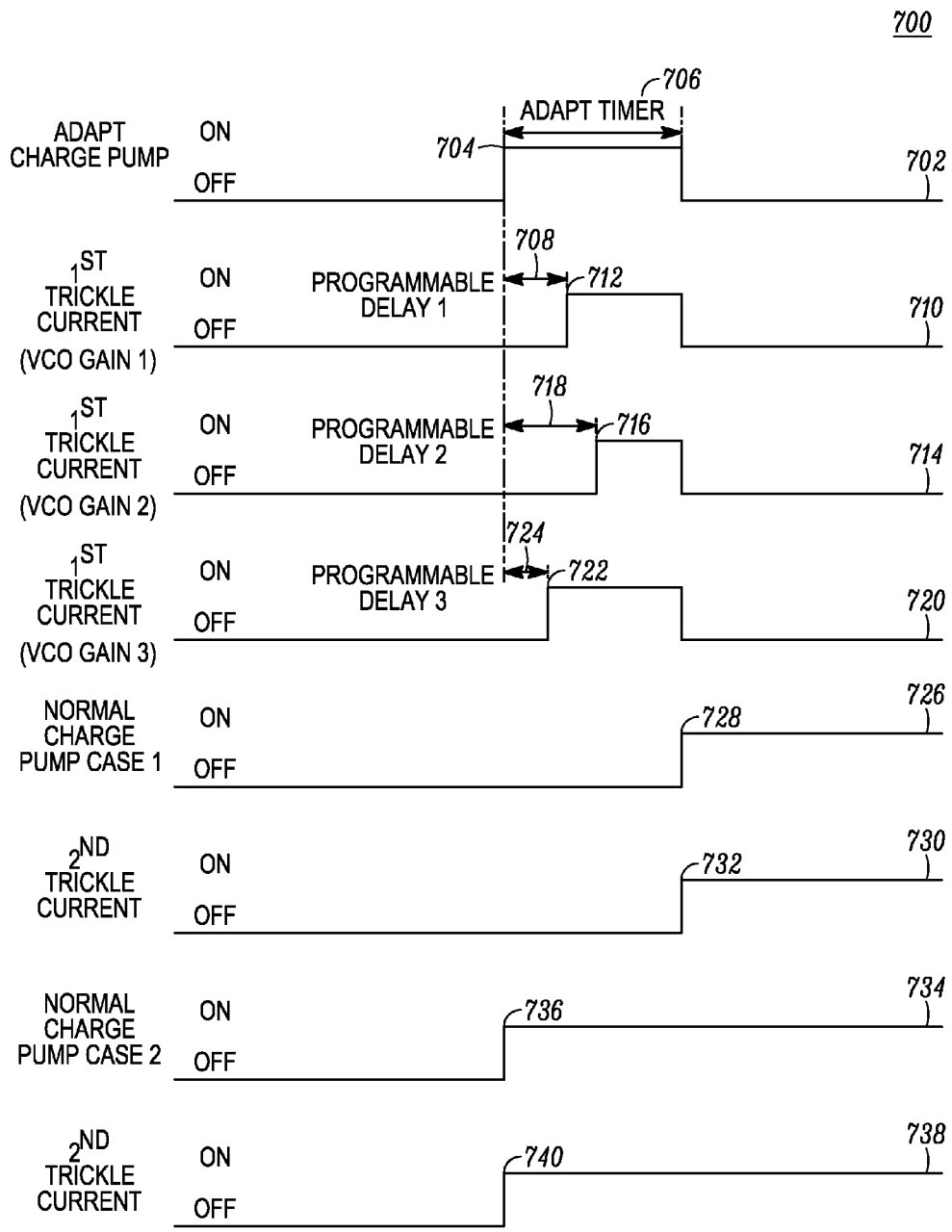
FIG. 7 is a timing diagram illustrating timing transition examples for adapt and normal mode of operations in accordance with some embodiments of the invention.

FIG. 7 is a timing diagram 700 illustrating timing transition examples for adapt and normal mode of operations in accordance with some embodiments of the invention. Adapt mode charge pump 702 is enabled at 704 for a predetermined adapt time 706. A programmable delay is determined and applied to the first trickle current based on the variable oscillator gain. Three cases of trickle current 710, 714 and 720 are illustrated for different oscillator gains: VCO gain 1, VCO gain 2 and VCO gain 3. In case of VCO gain 1, upon expiration of a determined programmable delay period 708, a first trickle current 710, the adapt mode trickle current, is applied to the adapt mode charge pump at 712. Similarly, in cases of VCO gains VCO gain 2/VCO gain 3, a first trickle current 714/720 is applied to the adapt mode charge pump at 716/722 upon expiration of a determined programmable delay period 718/724. Notably, as illustrated, the delays 708, 718, and 724 are different for different oscillator gains. The delays 708, 718, and 724 are determined based on the control signal received via the controller. In turn, the control signal is based on the oscillator's gain information given by the oscillator gain values, for instance, VCO gain 1, VCO gain 2, etc.

Timing diagram 700 also illustrates timing transition examples for normal mode of operation in PLLs implementing methods of FIG. 5 and FIG.6. Case 1 illustrates the PLL transition from adapt mode of operation to the normal mode of operation at the end of adapt mode. In case 1, the first (adapt mode) trickle current is turned off upon expiration of the adapt timer 706, thereby transitioning the PLL into a normal mode operation at 728 via normal charge pump 726 having a second (normal mode) trickle current 730 applied thereto at 732. Alternatively, case 2 illustrates transition examples for PLL with simultaneous adapt and normal mode of operations. In case 2, a normal charge pump 734 is turned on at 736 at the same time 704 as the adapt mode charge pump 702 with a second trickle current 738 being applied thereto at 740. Thus, the normal charge pump may be enabled at the beginning or end of the adapt time 706. In either case, the adapt charge pump is turned on and the application of the adapt trickle current is programmably delayed based on the oscillator's gain information.

Thus, there has been provided a system and a method for reducing the transient responses in a PLL with variable oscillator gain. The programmable delay in the charge pump is configured based on the variable oscillator gain for the PLL. The configured programmable delay is used in the adapt mode of operation for adding a trickle current to the adapt mode output. The transient responses of the PLL are reduced by introducing a delay of variable time period before the trickle current is added to the adapt mode output. The variable delay is introduced by the programmable delay which is configured for minimizing the transient responses of the PLL. As a result, the lock time for the PLL is reduced as well.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A phase lock loop (PLL) comprising:
a phase detector receiving a reference frequency signal;
a loop divider coupled to the phase detector for providing a feedback frequency signal;
a charge pump having an adapt mode and a normal mode of operation, the charge pump having a programmable delay wherein the adapt mode of operation is initialized with a time period of the programmable delay prior to having an adapt mode trickle current added to an adapt mode output and wherein the charge pump is coupled to the phase detector;
a loop filter coupled to the charge pump;
a voltage controlled oscillator (VCO) coupled to the loop filter and the loop divider, wherein VCO output forms a PLL output having variable gain; and
a controller receiving variable gain information of the VCO to provide a control signal to the charge pump for configuring the programmable delay such that transient discontinuity responses are shifted into the adapt mode of operation prior to and independent of normal mode operation during lock acquisition.

2. The PLL of claim 1, wherein the normal mode of operation is initialized at an end of the adapt mode of operation.

3. The PLL of claim 1, wherein the normal mode of operation and the adapt mode of operation are initialized simultaneously.

4. The PLL of claim 1, wherein the normal mode of operation further comprises a normal mode trickle current added to a normal mode output of the charge pump.

5. The PLL of claim 1, wherein the gain information of the VCO is based on a loop filter output voltage and a loop divider value.

6. The PLL of claim 5, wherein the loop divider value is provided to the loop divider by the controller, the loop divider value being determined by dividing a desired PLL output frequency by the reference frequency.

7. A phase lock loop (PLL) comprising:
a controller receiving a gain information from a voltage controlled oscillator (VCO) for generating a control signal; and
a charge pump comprising:
an adapt mode charge pump enabled for a first predetermined period of time prior to having a first trickle current added to an output, the first predetermined period being programmable responsive to the control signal;
a first trickle current source for providing the first trickle current wherein, upon expiration of a second predetermined period of time, the first trickle current is turned off and the adapt mode charge pump is disabled; and
a normal mode charge pump wherein the normal mode charge pump operates independent of the adapt mode charge pump.

8. The PLL of claim 7, wherein the normal mode charge pump is activated upon the expiration of the second predetermined period of time.

9. The PLL of claim 7, wherein the normal mode charge pump is activated at a time of activation of the adapt mode charge pump.

10. The PLL of claim 7, wherein the normal mode charge pump is coupled to a second trickle current source for adding a second trickle current to a normal mode output.

11. The PLL of claim 7, wherein the gain information of the VCO is determined by a loop filter output voltage and a loop divider value.

12. The PLL of claim 11, wherein the loop divider value is provided to the loop divider by the controller, the loop divider value being determined by dividing a desired PLL output frequency by the reference frequency.

13. The PLL of claim 7, wherein the first predetermined period of time is programmable using a programmable delay in the first trickle current source.

14. The PLL of claim 7, wherein the second predetermined period of time is a time period for which the adapt mode charge pump remains on.

15. A method for reducing transient discontinuity responses in a phase lock loop (PLL) comprising:
configuring a programmable delay based on gain information for a voltage controlled oscillator (VCO) in the PLL, the gain information of the VCO being variable;

receiving a reference frequency signal;
receiving a feedback frequency signal;
initializing an adapt mode of operation for a charge pump in the PLL;
during a convergence period occurring in the adapt mode of operation, adding an adapt mode trickle current to an adapt mode output of the charge pump after waiting for a time period configured by the programmable delay thereby shifting transient discontinuity responses into the adapt mode convergence period;
disabling the adapt mode of operation after a predetermined time period; and
initializing a normal mode charge pump operation after the adapt mode convergence period expires.

16. The method of claim 15, wherein the initializing of the normal mode of operation further comprises adding a normal mode trickle current to a normal mode output.

17. The method of claim 15, wherein the initializing of the normal mode of operation further comprises enabling a normal mode charge pump.

18. The method of claim 15, wherein the configuring of the programmable delay further comprises:
characterizing the gain information based on oscillator type;
storing delay information for the characterized gain information; and
generating the programmable delay based on the delay information for desired frequency of a PLL output and the oscillator type.

19. A method for reducing discontinuity responses in a phase lock loop (PLL) comprising:
configuring a programmable delay based on gain information for a voltage controlled oscillator (VCO) in the PLL, the gain information of the VCO being variable;
receiving a reference frequency signal;
receiving a feedback frequency signal;
initializing an adapt mode of operation for a charge pump in the PLL, wherein the initializing of the adapt mode of operation further comprises:
starting an adapt timer and a delay timer; and
enabling an adapt mode charge pump
adding an adapt mode trickle current to an adapt mode output of the charge pump after waiting for a time period of the configured programmable delay during the adapt mode of operation; and
disabling the adapt mode of operation after a predetermined time period.

20. The method of claim 19, wherein the adding of the adapt mode trickle current further comprises:
comparing the delay timer to the time period of the configured programmable delay; and
adding the adapt mode trickle current to the adapt mode output on the delay timer equaling and exceeding the time period of the configured programmable delay.

21. A method for reducing transient responses in a phase lock loop (PLL) comprising:
configuring a programmable delay based on gain information for a voltage controlled oscillator (VCO) in the PLL, the gain information of the VCO being variable;
receiving a reference frequency signal;
receiving a feedback frequency signal;
initializing an adapt mode of operation for a charge pump in the PLL;
adding an adapt mode trickle current to an adapt mode output of the charge pump after waiting for a time period of the configured programmable delay during the adapt mode of operation; and
disabling the adapt mode of operation after a predetermined time period, wherein disabling of the adapt mode of operation farther comprises turning off an adapt mode charge pump and the adapt mode trickle current when an adapt timer exceeds the predetermined time period.

22. A phase lock loop (PLL), including:
a synthesizer having an mode charge pump and a normal charge pump;
a loop filter coupled to the adapt mode charge pump and the normal mode charge pump;
a voltage controlled oscillator (VCO) coupled to the loop filter, the VCO having variable gain; and
a controller characterizing the variable gain of the VCO and generating a control signal in response thereto, the control signal adaptively delaying an application of trickle current to the adapt mode charge pump based on the variable gain prior to initialization of the normal mode charge pump.

23. The PLL of claim 22, wherein the charge pump operates under at least two modes of operation.

24. The PLL of claim 22, where the synthesizer comprises a divide by integer N synthesizer.

25. The PLL of claim 22, wherein the synthesizer comprises a fractional N synthesizer.

26. The PLL of claim 22, wherein the adaptive delay of the application of trickle current to the charge pump minimizes transient discontinuity responses caused by the VCO having variable gain, and a duration of the adaptive delay being determined by the variable gain.

* * * * *